United States Patent [19]

Flynn et al.

[11] Patent Number: 4,921,160
[45] Date of Patent: May 1, 1990

[54] PERSONAL DATA CARD AND METHOD OF CONSTRUCTING THE SAME

[75] Inventors: Richard M. Flynn, Indianapolis, Ind.; Fred W. Verdi, Lawrenceville, N.J.

[73] Assignee: American Telephone and Telegraph Company, New York, N.Y.

[21] Appl. No.: 161,515

[22] Filed: Feb. 29, 1988

[51] Int. Cl.$^5$ ............................................. G06K 19/06
[52] U.S. Cl. ..................................... 235/492; 235/488
[58] Field of Search ................................ 235/488, 492

[56] References Cited

U.S. PATENT DOCUMENTS

| | | | |
|---|---|---|---|
| 3,637,994 | 1/1972 | Ellingboe | 235/61.12 |
| 4,222,516 | 9/1980 | Badet et al. | 235/492 |
| 4,417,413 | 11/1983 | Hoppe et al. | 40/630 |
| 4,603,249 | 7/1986 | Hoppe et al. | 235/492 |
| 4,649,418 | 3/1987 | Uden | 357/80 |
| 4,692,604 | 9/1987 | Billings | 235/493 |
| 4,737,620 | 4/1988 | Mollet et al. | 235/492 |
| 4,746,392 | 5/1988 | Hoppe | 156/244 |
| 4,764,803 | 8/1988 | Ueda | 357/72 |
| 4,843,225 | 6/1989 | Hoppe | 235/492 |
| 4,849,617 | 7/1989 | Ueda | 235/492 |

FOREIGN PATENT DOCUMENTS 2595848 9/1987 France .
58-210646 12/1983 Japan .
61-145696 7/1986 Japan .

*Primary Examiner*—David L. Trafton
*Attorney, Agent, or Firm*—Robert B. Levy

[57] ABSTRACT

A personal data card (10), comprised of a semiconductor chip (28), sealed by encapsulant (38) in an opening (26) in a body (12), is advantageously provided with a shock absorbing device (38) which substantially circumscribes the encapsulant to substantially isolate the encapsulant from the body of the card. By isolating the encapsulant from the card body, the shock absorbing device reduces the stresses transmitted from the card body into the capsulant and into the chip when the card is flexed. In this way the incidence of cracking of the chip caused by the stresses generated upon flexing of the card is reduced.

11 Claims, 2 Drawing Sheets

PERSONAL DATA CARD AND METHOD OF CONSTRUCTING THE SAME

TECHNICAL FIELD

This invention relates to a personal data card containing an electronic circuit comprised of one or more integrated circuit chips, and to a method of manufacturing such a card.

BACKGROUND ART

Presently, a number of electronics manufacturers are engaged in developing a personal data card which appears similar to a conventional plastic credit card, but additionally contains an electronic circuit, typically comprised of a memory and a microprocessor. The electronic circuit carried by the personal data card enables the card to store large amounts of information, far more than a conventional plastic credit card. Information carried by the card may be accessed and even altered once the card is inserted into a card reader adapted for this purpose. The ability of the personal data card to store large amounts of information makes it useful for many applications. For example, a personal data card could be used as a telephone credit card or a credit card.

An example of a personal data card is disclosed in U.S. Pat. No. 4,649,418, issued on Mar. 10, 1987, to E. Uden. The Uden personal data card is comprised of a PVC card body having at least one aperture sized to receive a carrier body which takes the form of an epoxy glass circuit board. Within the carrier body is a through hole, sized to accommodate a semiconductor chip which has a set of pads thereon, each coupled by a wire lead to a corresponding metallized area on the carrier body adjacent to the through hole. A frame, formed of fiber-reinforced epoxy resin, is placed on the carrier body about the through hole to serve as a dam to contain epoxy encapsulant admitted into the through hole in the carrier body to seal the chip therein. Each of a pair of cover plates is attached to opposite sides of the card body to seal the carrier body within the aperture in the card body.

The Uden personal data card is believed to suffer from the disadvantage that stresses applied to the card during flexing are likely to be transmitted through the card body and into the encapsulant and semiconductor chip, possibly causing chip cracking which will render the card inoperative. The incidence of chip cracking can be lessened by employing semiconductor chips which occupy a small surface area, typically less than 25 square millimeters. However, the amount of data that can be stored in a memory chip decreases when the size of the chip is decreased. Thus, restricting the size of the chip below 25 square millimeters restricts the amount of data that can be stored on the card.

Therefore, there is a need for a personal data card which exhibits reduced incidence of chip cracking without restricting the chip size.

BRIEF SUMMARY OF THE INVENTION

Briefly, a personal data card, which substantially overcomes the aforementioned disadvantage, is comprised of a card body which mounts at least one semiconductor chip. Typically, the chip is mounted within a recess in the card body so as to be supported by the bottom wall of the recess. A quantity of encapsulant is admitted into the recess to seal the chip therein. A resilient, shock-absorbing device, comprised of a ring or a plurality of ring segments of an elastomer (e.g silicone rubber) of a height at least as high as the chip, is contained in the card body, substantially coplanar with the chip, to substantially circumscribe the mass of encapsulant. The shock-absorbing device thus serves to substantially separate the encapsulant and the chip contained therein from the bulk of the card body. A cover overlies the recess in the card body. Upon flexing of the personal data card, lateral stresses which would otherwise be transmitted through the card body and into the encapsulant, and hence, the chip, are substantially absorbed by the resilient shock-absorbing device, thereby reducing the incidence of chip cracking which causes failure of the card.

DETAILED DESCRIPTION

Figure 1:
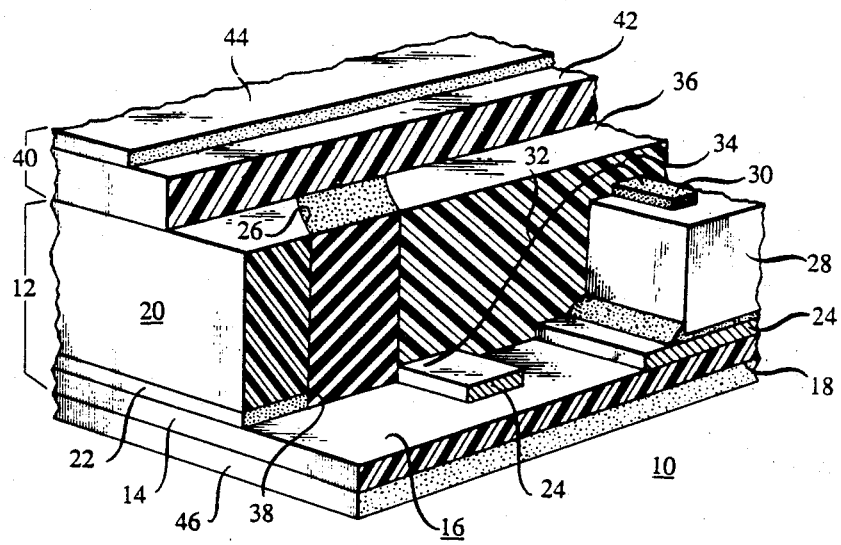
FIG. 1 is a partially cut away, perspective view of a personal data card, which includes a resilient shock-absorbing device in accordance with the present invention.
Figure 2:
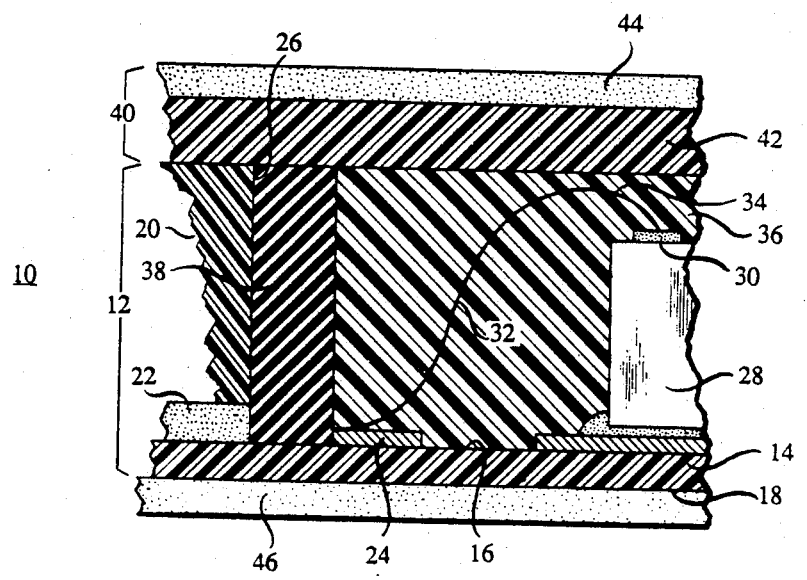
FIG. 2 is a cross-sectional side view of the personal data card of FIG. 1.

FIGS. 1 and 2 show a partially cut away, perspective view, and a cross-sectional side view, respectively, of a preferred embodiment of a personal data card 10 constructed in accordance with the present invention. The card 10 includes a card body 12 comprised of a circuit board 14 having first and second major surfaces 16 and 18, respectively. The card body 12 also includes a structural member 20 bonded onto the surface 16 of the circuit board 14 by a layer of adhesive 22. Both the circuit board 14 and the structural member 20 are fabricated from a very high modulus material, such as FR-4 or epoxy resin, for example. The circuit board 14 has a plurality of selectively interconnected metallized areas 24, typically gold or copper, formed on its surface 16. The structural member 20 has one or more apertures 26 typically circular in shape, extending therethrough for exposing selected groups of the metallized areas 24 on the surface 16 of the circuit board 14.

At least one semiconductor chip 28, typically a memory chip or the combination of a memory and microprocessor chip, has its undersurface secured to one or more of the metallized areas 24 which are exposed through the aperture 26. The chip 28 has a plurality of conductive pads 30, usually on its top, which are each selectively coupled by a separate one of a set of small diameter wires 32 to a separate one of the metallized pads 24 on the surface 16. Each wire 32 typically has a small loop 34 near the end thereof connected to the pad 30 on the chip 28 to afford the wire a small degree of strain relief. The loop 32 is sized so as to lie below the top of the structural member 20. It should be noted that the wires 32 are not the only mechanism by which the chip 28 can be electrically connected to the circuit board 14. Other well-known techniques, such as tab bonding and flip-chip bonding, could also be employed to electrically connect the chip 28 to the metallized areas 24.

Once the chip 28 has been electrically connected to the metallized areas 24 via the wires 34, then a quantity of encapsulant 36 is admitted into the opening 26 to seal the chip therein. The encapsulant 36, which is typically a silica-filled epoxy resin, is initially viscous when admitted into the opening 26 but later cures into a hard, solid mass having a modulus on the order of the circuit board 14 and the structural member 20. Thus, the encapsulant 36 will, when cured, provide a hard, protective shell about the chip 28.

In a preferred embodiment of the personal data card 10, the chip 28 is chosen to provide the card with a large memory capacity. As a consequence, the chip 28 tends to occupy a large area (>25 square millimeters) on the surface 16 of the circuit board 14. In the past, the use of such a large chip would have been avoided because of the increased incidence of chip cracking upon flexing of the card 10.

To overcome this problem, the personal data card 10 advantageously includes a shock-absorbing device 38 for reducing the stresses transmitted through the structural member 20 into the encapsulant 36 and the chip 28 upon flexing of the card. As best seen in FIG. 1, the shock-absorbing device 38 takes the form of a solid reslient ring, fabricated from an elastomer (e.g., silicone or latex rubber). The device 38 is sized to fit snugly within the opening 26 against the side walls thereof so as to be substantially coplanar with the chip 28 and substantialy flush with the top of the structural member 20. During manufacture of the card 10, the shock-absorbing device 38 is placed inside the opening 26 prior to the admission of the encapsulant 36. In this way, the shock-absorbing member 26 will circumscribe the encapsulant 36 once it has been admitted into the opening, thereby substantially isolating the encapsulant and the chip 28 therein from the structural member 20.

The resilient nature of the shock-absorbing device 38 affords it a much lower modulus than either the encapsulant 36 or the structural member 20. Since the shock-absorbing device 38 has a much lower modulus, the device is able to absorb a large portion of the lateral stresses transmitted into it from the structural member 20 when the card 10 is flexed. As a result, the stresses passing into the encapsulant 38, and hence, into the chip 28 from the structural member 20 are significantly reduced, thereby reducing the incidence of cracking of the chip.

In addition to the chip 28, one or more discrete devices (not shown) may be mounted to selected metallized areas 24 on the surface 16 which are exposed through one or more additional openings (not shown) in the structural member 20. Like the chip 28, these discrete components are typically sealed within the structural member 20 by way of an encapsulant (not shown) similar to the encapsulant 38. In order to reduce the stress on the discrete components created by flexing of the card 10, it may be useful to place a shock-absorbing device, similar to the device 38, within each opening in the structural member 20 containing the discrete components prior to the admission of the encapsulant therein. In this way, the encapsulant surrounding each of the discrete components will be circumscribed by the shock-absorbing device. By circumscribing the encapsulant surrounding each of the discrete components with a shock-absorbing device similar to the device 38, the discrete components, like the chip 28, will be subjected to much less stress upon flexing of the card 10.

As described above, the shock-absorbing device 38 is typically fabricated of a solid silicone or latex rubber ring which is pressed into the opening 26 in the structural member 20. Alternatively, the shock-absorbing member 38 could be formed of a highly viscous liquid elastomer precursor (not shown) directly extruded into the opening 26 prior to the admission of the encapsulant 36 therein. After being extruded into the opening 26, the liquid elastomer precursor is cured to provide a resilient ring-like structure which runs along the inside wall of the opening to circumscribe the chip 28. Finally, the encapsulant 36 is admitted into the opening 26 as before.

A cover 40, typically comprised of a layer 42 of epoxy resin impregnated with glass fiber so as to have a very high modulus, is bonded to the top surface of the structural member 20 to seal the recess 26 and thus overly the chip 28. Once the layer 42 is bonded onto the structural member 20, the shock-absorbing device 38 will be interposed between the layer and the circuit board 14. In addition to the epoxy layer 42, the cover 40 also may include a label 44 bonded to the top of the epoxy layer. The label 44 contains indicia (not shown) which serve to identify one of the pair of major surfaces of the card 10. Another indicia-bearing label 46, of the same thickness as the label 46, may be applied to the surface 18 of the circuit board 14 for identifying the other major surface of the card 10.

Figure 3:
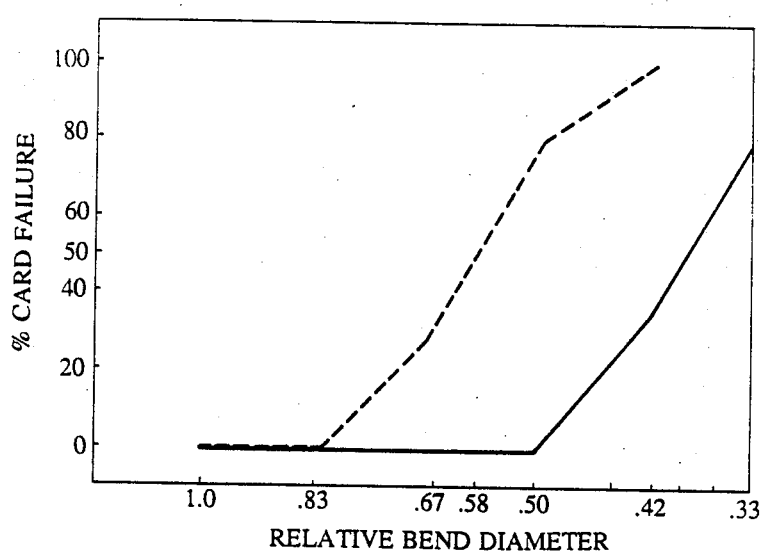
FIG. 3 is a graphical plot of the percentage failure versus relative bending diameter for personal data cards which include the shock-absorbing device of the present invention and for those personal data cards which do not.

In order to verify the efficacy of the shock-absorbing device 38, a quantity of the personal data cards 10 were bent over a plurality of cylinders (not shown) of successively smaller diameters in order to apply successively greater lateral stresses to the cards. Similarly, a quantity of control cards, each identical to the card 10 but lacking the shock-absorbing device 38, were also successively stressed in the same manner. In FIG. 3 there is shown a plot of the percentage failure versus the relative bend diameter (defined by the ratio of the largest or beginning cylinder diameter to the test cylinder diameter) for the cards with and without the shock-absorbing device 38. Card failure was deemed to have occurred when the circuitry on the card failed to operate properly, usually due to cracking of the semiconductor chip 28.

The dashed line in FIG. 3 represents the percentage failure as a function of bend diameter for those personal data cards lacking the shock-absorbing device 38. As can be seen in FIG. 3, those cards lacking the shock-absorbing device 38 of FIGS. 1 and 2 began to fail when the relative bend diameter ratio fell below 0.83. Nearly 50% of those cards lacking the shock-absorbing device 38 failed after the relative bend diameter ratio fell below 0.58.

The solid line in FIG. 3 represents the plot of the percentage failure versus bend diameter for the card 10 of FIGS. 1 and 2 whose semiconductor chip 28 was circumscribed by the shock-absorbing device 38. As may be appreciated, few if any of the cards 10 which included the shock-absorbing device 36 failed until the relative bend diameter ratio had fallen to below 0.50. Thus, it can be concluded that the shock-absorbing device 38 does significantly reduce the amount of stresses transmitted to the semiconductor chip 28 during flexing of the card 10.

Figure 4:
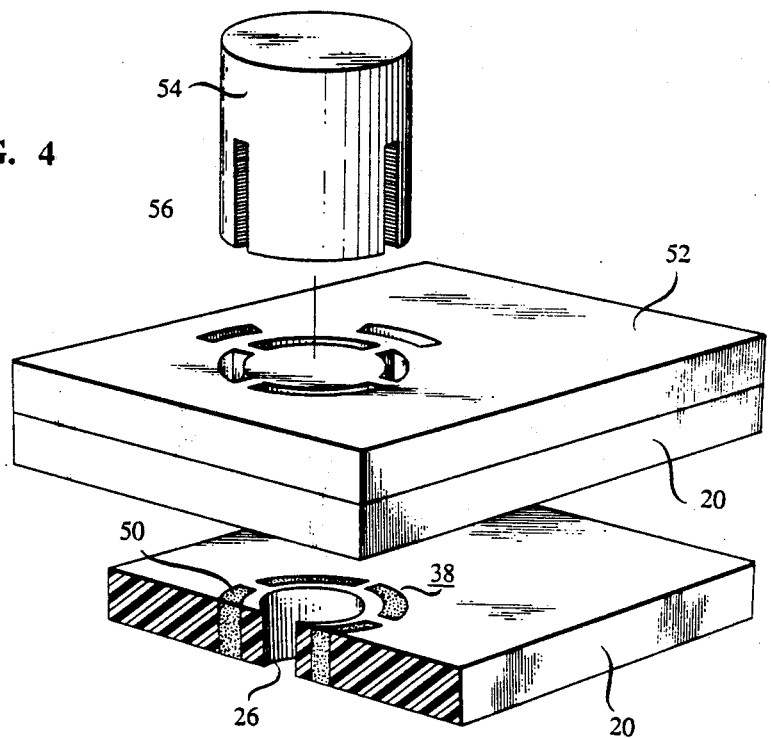
FIG. 4 is a partial perspective view of a portion of the data card of FIG. 1, showing an alternate embodiment of the shock-absorbing device.

Referring now to FIG. 4, the shock-absorbing device 38, instead of being configured of a solid ring, as shown in FIGS. 1 and 2, may be formed of a plurality of ring segments 50 which are embedded within the structural member 20 proximate the aperture 26 so as to substantially circumscribe the circumference thereof, and hence the mass of encapsulant 36 (see FIGS. 1 and 2). The ring segments 50 comprising the shock-absorbing device 38 of FIG. 4 are embedded in the structural member 20 by first overlying the member with a sheet of elastomer 52. A punch 54, configured with a set of cutting surfaces 56, each shaped in the form of ring segments spaced about a central axis, is driven through the sheet 52 and into the structural member 20 so that the ring segments 50 are punched out from the sheet and embedded into the structural member about the opening 26 therein in a single operation. It should be understood that ring segments 50, when embedded in the structural member 20 about the aperture 26, will be substantially coplanar with the chip 28 and will serve to substantially isolate the encapsulant 38 (see FIGS. 1 and 2) within the aperture 26 from the bulk of the structural member. Thus, the ring segments 50 comprising the shock-absorbing device 38 of FIG. 3 provide a similar degree of stress relief to the chip 28 (see FIGS. 1 and 2), as does the solid ring-type shock-absorbing device 38 of FIGS. 1 and 2.

The advantage obtained by configuring the shock-absorbing device 38 as a plurality of ring segments rather than a solid ring is that manufacturing of the card 10 is greatly facilitated. When the shock-absorbing device 38 is configured of a solid ring, as shown as in FIGS. 1 and 2, extreme care must be taken to size the ring properly; otherwise, if the ring is too large, insertion thereof into the aperture 26 becomes extremely difficult. Conversely, if the solid ring-type shock-absorbing device 38 of FIGS. 1 and 2 is significantly undersized, it can fall out of the aperture 26 in the structural member 20 if the card 10 is tilted during assembly. These problems are avoided by configuring the shock-absorbing member 38 as a plurality of ring segments 50 which are embedded directly in the structural member 28 about the periphery of the aperture 26.

It is to be understood that the that the above-described embodiments are merely illustrative of the principles of the invention. Various modifications and changes may be made thereto by those skilled in the art which will embody the principles of the invention and fall within the spirit and scope thereof.

What is claimed is:

1. A personal data card comprising:
a body having an opening;
at least one semiconductor chip received within said opening;
a mass of encapsulant admitted into the opening in said body to seal the chip therein; and
a cover overlying the substrate to seal the opening therein, characterized in that:
the body opening has a bottom wall to which the chip is bonded; and
shock absorbing means are provided to substantially circumscribe both the encapsulant and the semiconductor chip sealed therein and thereby substantially isolate the encapsulant and the chip from the body to reduce the stresses transmitted from the body into the encapsulant upon flexing of the substrate.

2. The card according to claim 1, characterized in that the shock absorbing means comprises an elastomeric ring located along the inside periphery of the opening in the body.

3. The card according to claim 1, characterized in that the shock absorbing means comprises a plurality of elastomeric ring segments embedded within the body proximate the opening therein to substantially circumscribe the periphery thereof.

4. The card according to claim 2, characterized in that said elastomeric ring is fabricated from a latex rubber.

5. The card according to claim 2, characterized in that said elastomeric ring is fabricated from silicone rubber.

6. The card according to claim 3, characterized in that said elastomeric ring is fabricated from a latex rubber.

7. The card according to claim 3, characterized in that said elastomeric ring is fabricated from silicone rubber.

8. A method for making a personal data card comprising the steps of:
placing at least one semiconductor chip into at least one opening in a body;
admitting encapsulant into the opening in the body to seal the chip; and
bonding a cover to said substrate to overly the opening therein, characterized in that:
the chip has one of its surfaces bonded to the body; and
shock-absorbing means are placed in the body prior to the admission of the encapsulant so as to substantially circumscribe the encapsulant and chip and thereby substantially isolate both the encapsulant and the chip from the body to reduce the stresses transmitted from the body into the encapsulant upon flexing of the body.

9. The method according to claim 8, characterized in that the shock-absorbing means are placed into the opening in the body to fit snugly therein.

10. The method according to claim 8, characterized in that the shock-absorbing means is embedded into the body in proximity to the opening to substantially circumscribe the periphery thereof.

11. The method according to claim 8, characterized in that said shock-absorbing device is placed within said body by directly extruding a viscous liquid elastomer precursor into said opening and then curing said elastomer to yield a resilient ring-like structure running along the inside wall of said opening.

* * * * *